United States Patent
Liu et al.

(10) Patent No.: US 10,256,222 B2
(45) Date of Patent: Apr. 9, 2019

(54) LIGHT EMITTING DIODE SUBSTRATE AND DISPLAY APPARATUS APPLYING THE SAME

(71) Applicant: Innolux Corporation, Miao-Li County (TW)

(72) Inventors: Tung-Kai Liu, Miao-Li County (TW); Tsau-Hua Hsieh, Miao-Li County (TW); Bo-Feng Chen, Miao-Li County (TW); Wan-Ling Huang, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/398,374

(22) Filed: Jan. 4, 2017

(65) Prior Publication Data

US 2017/0194307 A1    Jul. 6, 2017

Related U.S. Application Data

(60) Provisional application No. 62/274,809, filed on Jan. 5, 2016.

(30) Foreign Application Priority Data

Apr. 13, 2016  (TW) .............................. 105111527 A

(51) Int. Cl.
*H01L 27/32*    (2006.01)
*H01L 25/18*    (2006.01)
(Continued)

(52) U.S. Cl.
CPC .......... *H01L 25/18* (2013.01); *H01L 25/0753* (2013.01); *H01L 25/50* (2013.01);
(Continued)

(58) Field of Classification Search
CPC ............ H01L 27/3213; H01L 27/3216; H01L 27/3218; H01L 27/124
See application file for complete search history.

(56) References Cited

U.S. PATENT DOCUMENTS 5,654,792 A    8/1997  Yonekawa
6,973,208 B2   12/2005 Kuwabara
(Continued)

FOREIGN PATENT DOCUMENTS

CN    103855187 A    6/2014
TW    201445711 A    12/2014

OTHER PUBLICATIONS

Taiwanese Office Action dated Jun. 22, 2017.

*Primary Examiner* — Phat X Cao
(74) *Attorney, Agent, or Firm* — Rabin & Berdo, P.C.

(57) ABSTRACT

A light emitting diode substrate includes a substrate, a plurality of first light emitting diode and second light emitting diode. The first light emitting diode are disposed on the substrate and arranged along a first direction and a second direction to form a first array. The first light emitting diode have a first side length extending along the first direction and a second side length extending along the second direction. The second light emitting diode are disposed on the substrate and arranged along the first direction and the second direction to form a second array. The second light emitting diode have a third side length extending along the first direction and a forth side length extending along the second direction. A first difference between the first side length and the third side length is less than a second difference between the second side length and the forth side length.

12 Claims, 7 Drawing Sheets

(51) Int. Cl.
*H01L 25/00* (2006.01)
*H01L 25/075* (2006.01)
*H01L 27/12* (2006.01)
*H01L 33/20* (2010.01)

(52) U.S. Cl.
CPC ........ *H01L 27/3213* (2013.01); *H01L 27/124* (2013.01); *H01L 27/1214* (2013.01); *H01L 33/20* (2013.01)

(56) References Cited

U.S. PATENT DOCUMENTS

| | | |
|---|---|---|
| 7,882,481 B2 | 2/2011 | Hempel |
| 2009/0115952 A1* | 5/2009 | Nakamura ............. G02B 5/201 349/143 |
| 2014/0120640 A1 | 5/2014 | Shieh et al. |
| 2015/0221710 A1* | 8/2015 | Motoyama .......... H01L 27/3218 257/89 |
| 2016/0253972 A1* | 9/2016 | Bai ...................... G09G 3/3208 345/690 |

* cited by examiner

LIGHT EMITTING DIODE SUBSTRATE AND DISPLAY APPARATUS APPLYING THE SAME

This application claims the benefits of U.S. provisional application Ser. No. 62/274,809, filed Jan. 5, 2016, and Taiwan application Serial No. 105111527, filed Apr. 13, 2016, the subject matters of which are incorporated herein by reference.

BACKGROUND OF THE INVENTION

Field of the Invention

The disclosure relates to a semiconductor substrate and apparatus applying the same, and more particularly to a light emitting diode (LED) substrate and display apparatus applying the same.

Description of the Related Art

A light emitting diode display, also referred to as a micro light emitting diode display, is a display with an array of micro size light emitting diode which are picked from a light emitting diode substrate (wafer) and then integrated with a thin-film-transistor (TFT) circuit by bounding treatment to form an electrical connection and serve as pixels (sub-pixels) for the display. Because of the self-illumination properties of the light emitting diode display, the backlight module can be omitted. As a result, the light emitting diode display can be thinner and lighter, and competitive advantages can be obtained. In comparison to an organic light emitting diode (OLED) display, the light emitting diode display is more stable and has longer life time, higher brightness and shorter response time. Thus, the light emitting diode display is gradually adopted in mainstream display products of next generation.

However, it is difficult to pick the light emitting diodes from a light emitting diode substrate (wafer) and bond onto the sub-pixel array of the light emitting diode display precisely and stably, because of the following facts that since pitch of two adjacent light emitting diodes on the substrate is less than pitch of two adjacent sub-pixels of the light emitting diode display, and tools for performing these operations are merely designed in accordance with the dimension of the sub-pixel array but not considering the dimension of the light emitting diode substrate (wafer). Efficiency and robustness of the process for fabricating the light emitting diode display cannot be improved.

SUMMARY OF THE INVENTION

One disclosure relates to a light emitting diode substrate, wherein the light emitting diode substrate includes a substrate, a plurality of first light emitting diodes and a plurality of second light emitting diodes. The first light emitting diodes are disposed on the substrate and arranged in a first direction and a second direction. The first light emitting diodes have a first side length extending in the first direction and a second side length extending in the second direction. The second light emitting diodes are disposed on the substrate and arranged in the first direction and the second direction. The second light emitting diodes have a third side length extending in the first direction and a fourth side length extending in the second direction. Wherein a first difference between the first side length and the third side length is less than a second difference between the second side length and the fourth side length.

Another disclosure relates to a light emitting diode display apparatus applying the light emitting diode substrate as discussed above, wherein the light emitting diode display apparatus includes a displaying region having a first sub-pixel and a second sub-pixel. The first sub-pixel includes a first light emitting diode having a first side length and a second side length. The second sub-pixel includes a second light emitting diode having a third side length and a fourth side length. Wherein a first difference between the first side length and the third side length is less than a second difference between the second side length and the fourth side length.

In accordance with the aforementioned embodiments of the disclosure, a light emitting diode substrate and a display apparatus applying the same are provided. At least two kinds of light emitting diodes with different dimensions are formed on the light emitting diode substrate, and the dimensions and the arrangements of these at least two kinds of light emitting diodes that are formed on the light emitting diode substrate can be determined in accordance with (by cross-referencing) the design dimension of the tools used to pick up the light emitting diodes from the light emitting diode substrate and the design dimension of a sub-pixel array of the display apparatus on which the light emitting diodes are bonded. The tools to implement the process of fabricating the display apparatus thus can pick up a plurality of light emitting diodes from the light emitting diode substrate at one time and then bond the picked light emitting diodes onto the TFT sub-pixel array of the display apparatus precisely. The efficiency and robustness of the process of fabricating the light emitting diode display can be thus improved.

BRIEF DESCRIPTION OF THE DRAWINGS

The above and other aspects of the disclosure will become better understood with regard to the following detailed description of the preferred but non-limiting embodiment(s). The following description is made with reference to the accompanying drawings.

DETAILED DESCRIPTION OF THE INVENTION

The embodiments of the disclosure disclose a light emitting diode substrate and a display apparatus applying the same for improving the efficiency and the robustness of the process for fabricating the light emitting diode display. The above and other objects, features and advantages of the disclosure will become better understood with reference to a number of exemplary embodiments disclosed below with accompanying drawings.

It is to be understood that the specific implementations and methods disclosed below are not for the limitation of the disclosure, which can also be implemented by using other features, components, methods and parameters. The exemplary embodiments disclosed below are to exemplify the technical features of the disclosure only, not for limiting the scope of protection of the disclosure. Anyone who is disciplined in the technology field will be able to make equivalent modification and variations according to the descriptions of the specification without violating the spirit of the disclosure. For components common to different embodiments and drawings, the same numeric designations are used.

Figure 1:
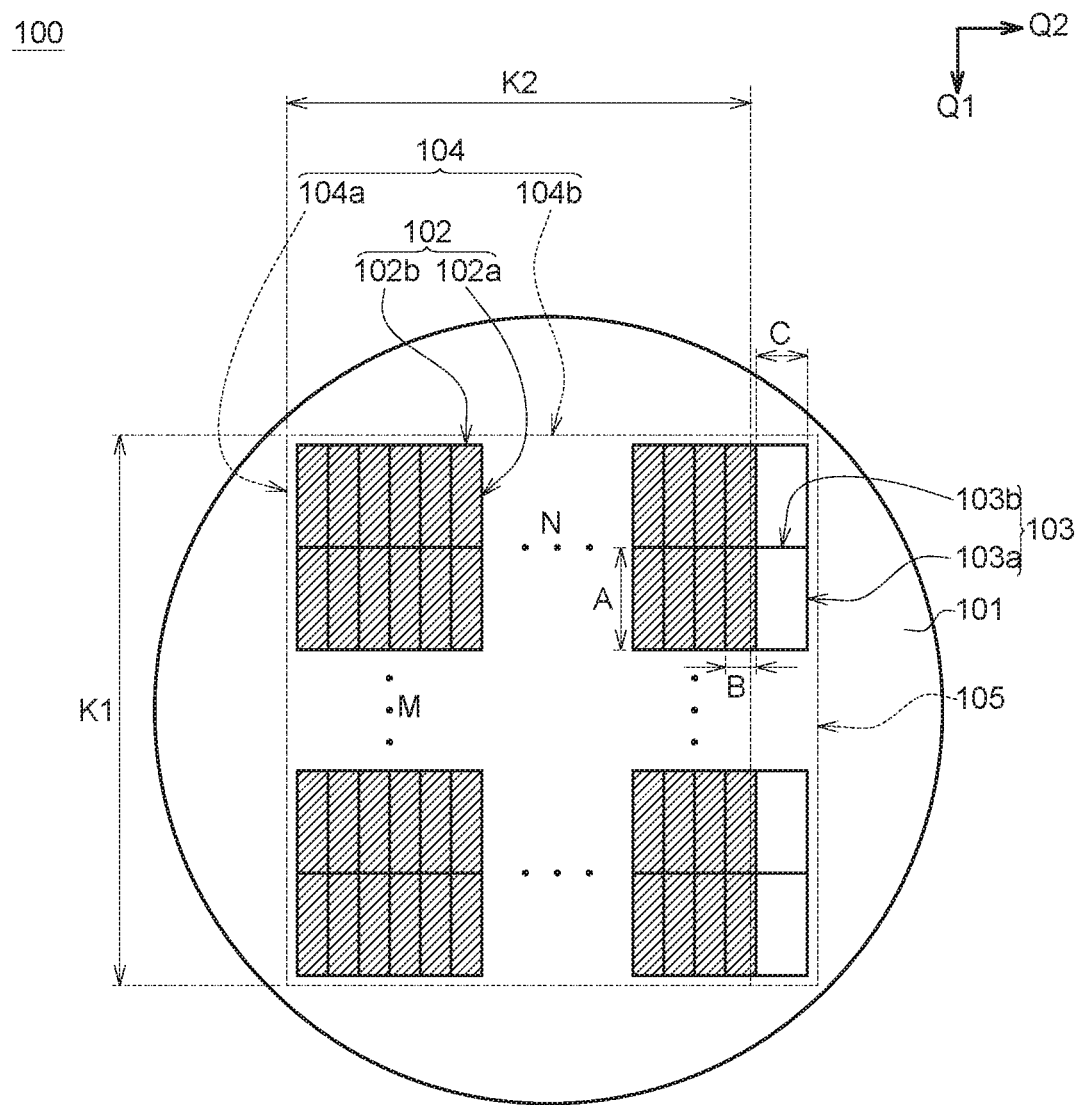
FIG. 1 is a top view illustrating a light emitting diode substrate according to one embodiment of the disclosure.

FIG. 1 is a top view illustrating a light emitting diode substrate 100 according to one embodiment of the disclosure. The light emitting diode substrate 100 includes a substrate 101, a plurality of first light emitting diodes 102 and a plurality of second light emitting diodes 103. In some embodiments of the disclosure, the substrate 101 can be a base board allowing a thin film layer formed thereon, and the base board is made of a material selected from a group consisting of sapphire, silicon carbide (SiC), silicon (Si) (wafer), zinc oxide (ZnO), magnesium oxide (MgO), aluminum nitride (AlN), gallium nitride (GaN), glass, quartz and the arbitrary combinations thereof. In some embodiments of the disclosure, the substrate 101 can be a flexible board, bendable board, or a folded board made of a plastic material selected from a group consisting of poly vinyl chloride (PVC), polyethylene terephthalate (PET), polyimide (PI) and the arbitrary combinations thereof. In some embodiments of the disclosure, the substrate 101 can be a metal board made of a metal material selected from a group consisting of copper (Cu), Aluminum (Al), iron (Fe), steel and the arbitrary combinations thereof. The substrate 101 may comprises a circuit electrically connecting to a test tool that inspects the quality of light emitting diodes. The substrate 101 may have a circular top view profile, a rectangular top view profile or other top view profile with suitable shape for better arrangement and better space utilization.

The first light emitting diodes 102 and the second light emitting diodes 103 are formed on the substrate 101 by epitaxial growth or thin film deposition technologies incorporated with lithographic and etching processes. Both the first light emitting diodes 102 and the second light emitting diodes 103 may have individual unit sizes ranging from 0.1 µm to 150 µm, and preferably ranging from 0.1 µm to 20 µm. Such that, the first light emitting diodes 102 and the second light emitting diodes 103 may be referred to as micro light emitting diodes (micro size light emitting diodes). In the embodiment, the unit size is the minimum pitch (minimum repeat distance) between two identical adjacent light emitting diodes. In some embodiments, the unit size of light emitting diodes may be referred as the maximum side length or average diameter length of the light emitting diodes. The number of the first light emitting diodes 102 is greater than the number of the second light emitting diodes 103. The first light emitting diodes 102 and the second light emitting diodes 103 may have a top view profile shaped as a rectangle, a square, a parallelogram or other regular/irregular architectures. In the embodiment, as shown in FIG. 1, the first light emitting diodes 102 and the second light emitting diodes 103 may have a top view profile that is shaped as a parallelogram (a rectangle) having a first side 102a and a second side 102b; and the first light emitting diodes 102 and the second light emitting diodes 103 are arranged side by side to form a first array 104. In some embodiments of the disclosure, the light emitting diode substrate 100 can include more than one first array 104, and two adjacent first arrays 104 may be separated by a gap. The gap between two adjacent first arrays 104 may be different when the two adjacent first arrays 104 are arranged in different directions (e.g. first direction Q1 and second direction Q2).

Refer to FIG. 1, the first array 104 constituted by the first light emitting diodes 102 is a parallelogram array having a first array side 104a and a second array side 104b, wherein the first array side 104a is connected with the second array side 104b. The first array side 104a extends in a first direction Q1, and the first array side 104a comprises a first extending length K1. The second array side 104b extends a second extending direction Q2, and the second array side 104b comprises a second extending length K2. In some embodiments, the first direction Q1 may be perpendicular to the second direction Q2 (so as to form an orthogonal angle). However, in some other embodiments, the first direction Q1 and the second direction Q2 may form an inclined angle. There are N columns of the first light emitting diodes 102 arranged along the second array side 104b to make the first sides 102a of two adjacent first light emitting diodes 102 parallel stood side by side; meanwhile, there are M rows of the first light emitting diodes 102 are arranged the first array side 104a to make the second sides 102b of two adjacent first light emitting diodes 102 stood side by side, and the first array 104 comprises N columns and M rows (N×M, wherein N and M are positive integers, respectively) of the first light emitting diodes 102. Since the first sides 102a extends in the first direction Q1 and the second sides 102b extends in the second direction Q2, the first extending length K1 of the first array 104 may be M times length of the first sides 102a and the second extending length K2 of the first array 104 may be N times of the second side length of the second side 102b. In the embodiment, the first side length of the first sides 102a is greater than the second side length of the second side 102b. Alternatively, in some other embodiment, the first side length of the first sides 102a may be less than or equal to the second side length of the second side 102b.

In some embodiments, the light emitting diode substrate 100 includes at least one second array 105 disposed adjacent to the first array 104. Similarly, the second array 105 may be an N'×M' array (wherein N' and M' are positive integers, respectively) constituted by N' columns of the second light emitting diodes 103 and M' rows of the second light emitting diodes 103. In the embodiment, the second array 105 is disposed adjacent to the first array side 104a of the first array 104. In other embodiments, the second array 105 may be disposed adjacent to the second array side 104b of the first array 104. In the embodiment, N' is equal to 1 (N'=1) and the M' is equal to M (M'=M). In other embodiments, N' and M' may be any other sets of integers other than 1 and M. In other words, the second array 105 may be constituted by pluralities of columns and rows of the second light emitting diodes 103. In the embodiment, the second light emitting diode 103 has a third side 103a and a fourth side 103b connected with each other. The fourth sides 103b of two adjacent second light emitting diodes 103 stand side by side, the third sides of the second light emitting diodes 103 are parallel to arrange along the first array side 104a to make the third sides 103a of two adjacent second light emitting diodes 103 stood side by side. The third sides 103a has a third side length substantially equal to the first side length of the first sides 102a, and the fourth sides 103b has a fourth side length not equal to the second side length of the second sides 102b. In other words, a difference between the first side length and the third side length is less than a difference between the second side length and the fourth side length. In the embodiment, the third side length of the third sides 103a is greater than the fourth side length of the fourth sides 103b. In other embodiments, the third side length of the third sides 103a may be less than or equal to the fourth side length of the fourth sides 103b. The light emitting diode substrate 100 may include a plurality of the first arrays 104 and at least one second array 105 may be disposed between two adjacent ones of the plurality of the first arrays 104.

The first side length of the first sides 102a may be substantially equal to A, and the second side length of the second sides 102b may be substantially equal to B. The first sides 102a of the first light emitting diode chips 102 are parallel to the first array side 104a, and the second sides 102b of the first light emitting diode chips 102 are parallel to the second array side 104b. The third side length of the third sides 103a may be substantially equal to A, and the fourth side length of the fourth sides 103b may be substantially equal to C. The third sides 103a of the second light emitting diode chips 103 are parallel to the first array side 104a, and the fourth sides 103b of the second light emitting diode chips 103 are parallel to the second array side 104b. In the embodiment, the first light emitting diode chips 102 and the second light emitting diode chips 103 that is parallel to the first array side 104a (extending in the first direction Q1) may have a side length substantially equal to A. The first light emitting diode chips 102 and the second light emitting diode chips 103 may have one side with an identical side length and another side with different side lengths. In other words, a difference between the first side length and the third side length is less than a difference between the second side length and the fourth side length.

It should note that the dimensions of the second side length of the first light emitting diode 102 and the fourth side length of the second light emitting diode 103 may not be limited to this regards. In some embodiments, the relationship between the second side length of the first light emitting diode 102 and the fourth side length of the second light emitting diode 103 may be represented by the following equation:

$$100\% > \left|\frac{C-B}{B}\right| > 1\%$$

Wherein B is different from C, as shown in FIG. 1; B can be greater than or less than C; A can be greater than, equal to or less than B; and A can be greater than, equal to or less than C.

Figure 2:
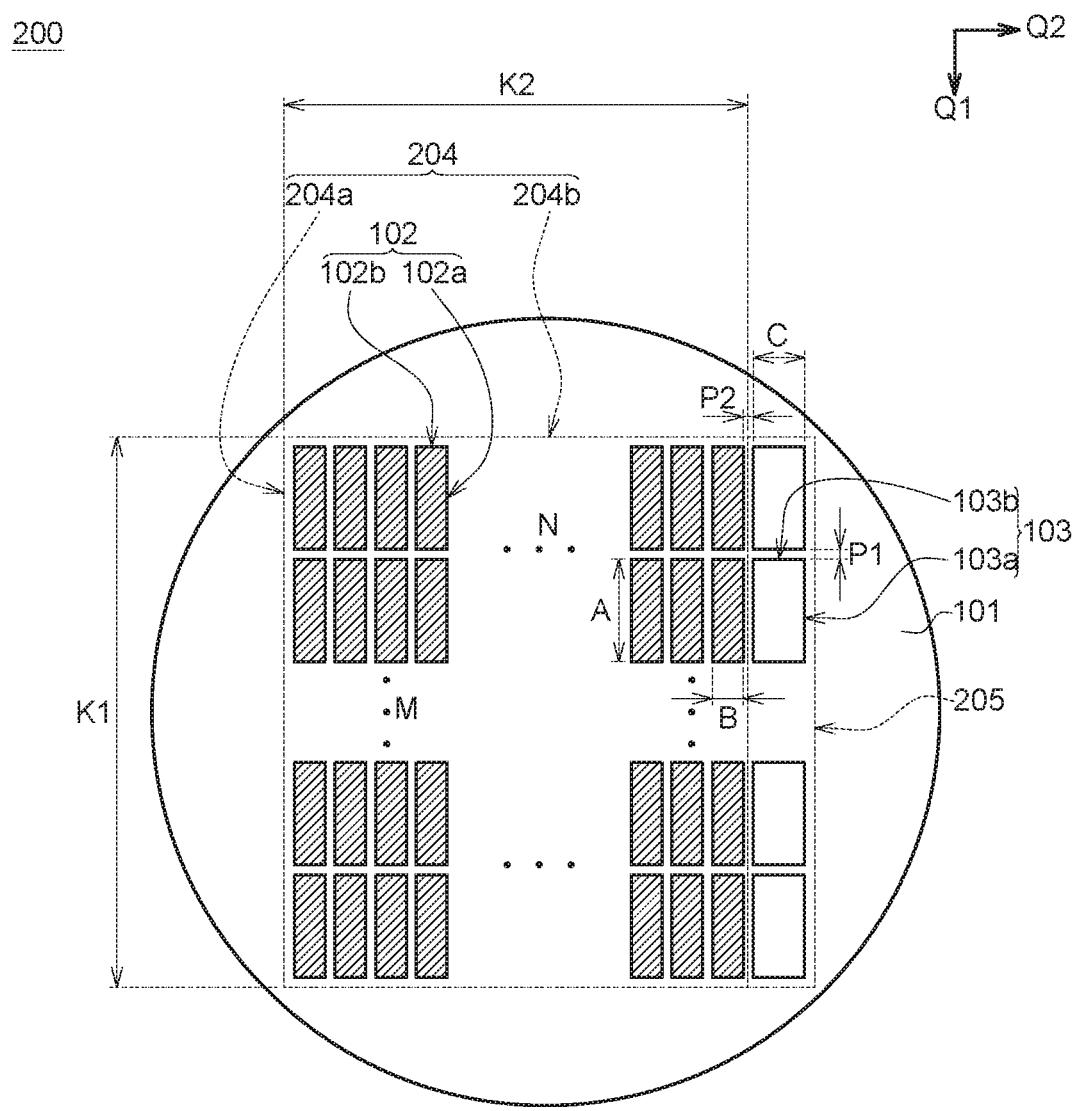
FIG. 2 is a top view illustrating a light emitting diode substrate according to another embodiment of the disclosure.

FIG. 2 is a top view illustrating a light emitting diode substrate 200 according to another embodiment of the disclosure. The structure of the light emitting diode substrate 200 is similar to that of the light emitting diode substrate 100 except that there is a gap between two adjacent first light emitting diodes 102 or two adjacent second light emitting diodes 103. The light emitting diode substrate 200 also includes at least one first array 204 and at least one second array 205.

For example, there is a first gap P1 between the two adjacent rows of the first light emitting diodes 102 perpendicular to the first array side 204a of the first array 204 (parallel arranged in the first direction Q1); and there is a second gap P2 between the two adjacent columns of the first light emitting diodes 102 perpendicular to the second array side 204a of the first array 204 (parallel arranged in the second direction Q2). A gap between the first array 204 and the second array 205 substantially equal to the second gap P2. In other words, ones of the first light emitting diodes 102 disposed on the edge of the first array 204 separated from the adjacent one of the second light emitting diodes 103 by a gap substantially equal to the second gap P2. In some other embodiments, the distance between the first array 204 and the second array may be different to the second gap P2.

Figure 3:
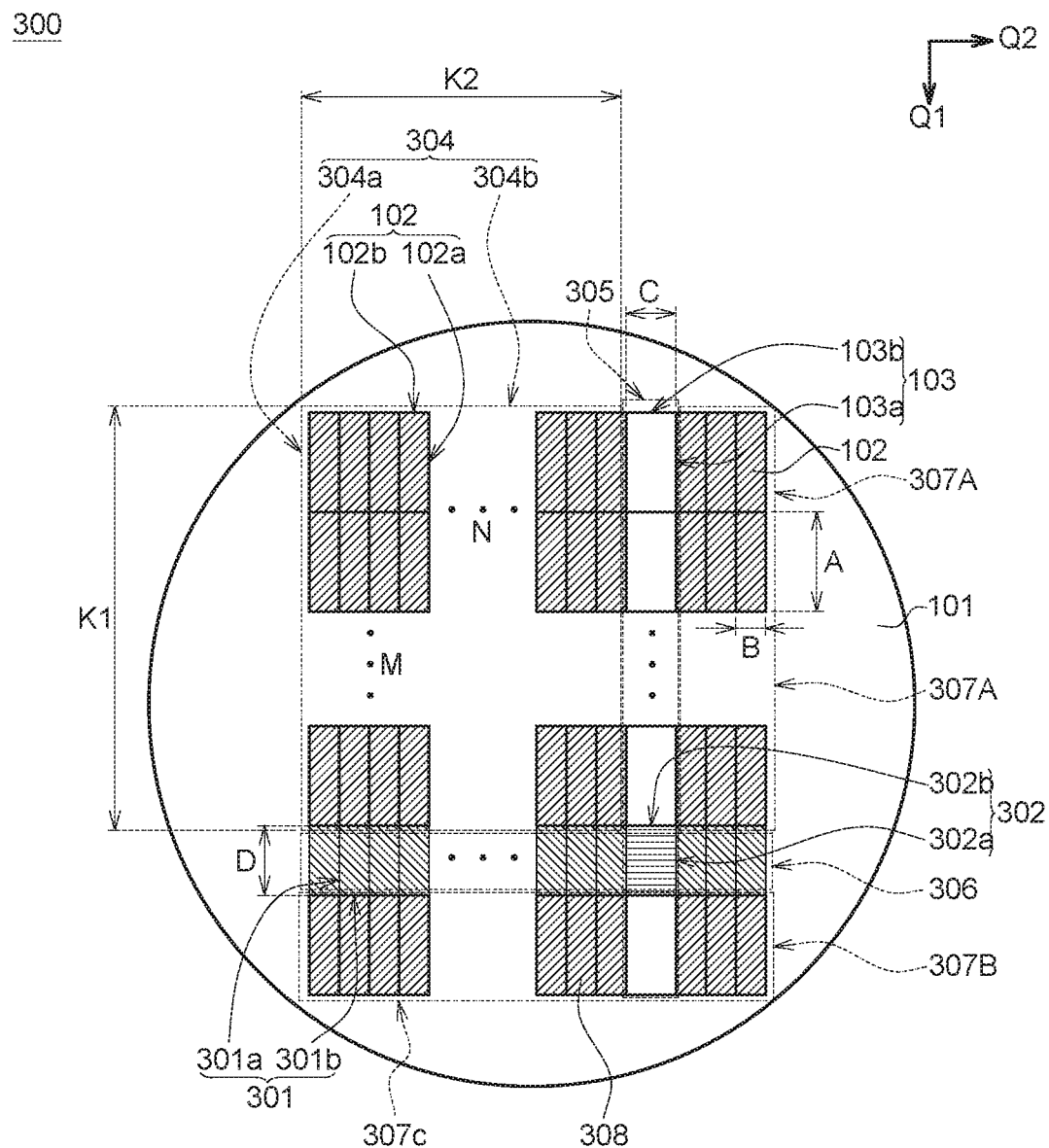
FIG. 3 is a top view illustrating a light emitting diode substrate according to yet another embodiment of the disclosure.

FIG. 3 is a top view illustrating a light emitting diode substrate 300 according to another embodiment of the disclosure. The structure of the light emitting diode substrate 300 is similar to that of the light emitting diode substrate 100 except the light emitting diode substrate 300 further includes a plurality of third light emitting diodes 301 and at least one fourth light emitting diode chip 302. The third light emitting diodes 301 and the at least one fourth light emitting diode 302 have a unit size substantially ranging from 0.1 μm to 150 μm, and preferably ranging from 0.1 μm to 20 μm. The third light emitting diodes 301 and the at least one fourth light emitting diode 302 can be also referred to as micro light emitting diodes (micro size light emitting diodes). In the embodiment, the number of the first light emitting diodes 102 is substantially greater than the number of the second light emitting diodes, the third light emitting diodes 301 or the at least one fourth light emitting diode 302 respectively.

Third light emitting diodes 301 and the at least one fourth light emitting diode 302 are also formed on the substrate 101 by epitaxial growth or thin film deposition technologies incorporated with lithographic and etching processes. In the embodiment, a third array 306 constituted by the third light emitting diodes 301 is disposed adjacent to the first array 304. The third array 306 can be an N"×M" array (wherein N" and M" are positive integers, respectively) constituted by N" columns of the third light emitting diodes 301 and M" rows of the third light emitting diodes 301. In the embodiment, the third array 306 is disposed adjacent to the second array side 304b of the first array 304. In other embodiments, the third array 306 may be disposed adjacent to the first array side 304a of the first array 304. In the embodiment, N" is equal to 1 (N"=1) and the M" is equal to M (M"=M). In other embodiments, N" and M" may be other sets of integers differing from 1 and M. In other words, the third array 306 may be constituted by pluralities of columns and rows of the third light emitting diodes 301. In the embodiment, the third light emitting diode 301 has a fifth side 301a and a sixth side 301b connected with each other. The fifth side 301a of the third light emitting diodes 301 are parallel arranged along the second array side 304b of the first array 304 (in the second direction Q2) to make the fifth sides 301a of two adjacent fifth sides 301a stood side by side. A fourth array constituted by a plurality of the fourth light emitting diodes 302 is disposed at the cross areas at which the second array 305 intersects the third array 306. The fourth array can be an N'''×M''' array (wherein N''' and M''' are positive integers, respectively) constituted by N''' columns of the fourth light emitting diodes 302 and M''' rows of the fourth light emitting diodes 302. In the embodiment, N''' is equal to 1 (N'''=1) and the M''' is equal to 1 (M'''=1). In other embodiments, N''' and M''' may be other integers differing from 1. In other words, the fourth array may be constituted by pluralities of columns and rows of fourth light emitting diodes 302. The light emitting diode substrate 300 may include a plurality of the first arrays 304, at least one thirds array 306 and at least one fourth array; the thirds array 306 and the fourth array may be both disposed between two adjacent ones of the plurality of the first arrays 304.

The third light emitting diodes 301 may have a top view profile shaped as a rectangle, a square, a parallelogram, a diamond or other regular/irregular shape. The fifth side 301*a* of the third light emitting diode 301 has a fifth side length substantially equal to D; and the sixth side 301*b* of the third light emitting diode 301 has a sixth side length substantially equal to B. The fifth side 301*a* of the third light emitting diode 301 extends in a direction (in the first direction Q1) parallel to the first array side 304*a* of the first array 304; and the sixth side 301*b* of the third light emitting diode 301 extends in a direction (in the second direction Q2) parallel to the second array side 304*b* of the first array 304. The fourth light emitting diodes 302 can also have a top view profile shaped as a rectangle, a square, a parallelogram, a diamond or other regular/irregular shape. The fourth light emitting diode 302 has a seventh side 302*a* and an eighth side 302*b* connected with each other. The eighth side 302*b* of the fourth light emitting diode 302 extending in a direction (the second direction Q2) parallel to the second array side 304*b* of the first array 304 has an eighth side length substantially equal to C. The seventh side 302*a* of the fourth light emitting diode 302 extending in a direction (in the first direction Q1) parallel to the first array side 304*a* of the first array 304 has a seven side length substantially equal to D.

As shown in FIG. 3, the third light emitting diode chips 301 and the fourth light emitting diode 302 that are parallel to the second array side 304*b* of the first array 304 (extending in the second direction Q2) may have a side length substantially equal to C. Similarly, the third light emitting diode chips 301 and the fourth light emitting diode 30 that is parallel to the first array side 304*a* of the first array 304 (extending in the first direction Q1) may have a side length substantially equal to D.

The side length dimensions of the first light emitting diode 102, the second light emitting diode 103, the third light emitting diode 301 and the fourth light emitting diode 302 may not be limited by this regards. In some embodiments, the relationship between the side length dimensions of the first light emitting diode 102, the second light emitting diode 103, the third light emitting diode 301 and the fourth light emitting diode 302 may be represented by the following equation:

$$100\% > \left|\frac{D-A}{A}\right| > 1\% \text{ and } 100\% > \left|\frac{C-B}{B}\right| > 1\%$$

Wherein B is different from C; B can be greater than or less than C; D is different from A; D can be greater than or less than A; A can be greater than, equal to or less than B; A can be greater than, equal to or less than C; D can be greater than, equal to or less than B; and D can be greater than, equal to or less than C.

In some embodiments, the light emitting diode substrate 300 may include a plurality of fifth light emitting diodes 308 arranging to form a plurality of arrays, such as the arrays 307A, 307B and 307C, on the substrate 101. In the embodiment, the dimension and the shape of the fifth light emitting diodes 308 are identical to that of the first light emitting diodes 102. However, the arrangements of the fifth light emitting diodes 308, such as the column and the row numbers thereof, used to constitute the arrays 307A, 307B and 307C may be different from that of the first light emitting diodes 102 used to constitute the first array 304. In some embodiments, first array 304 and the arrays 307A, 307B and 307C can be constituted by identical elements, the first light emitting diodes 102, if the arrangements of the fifth light emitting diodes 308 of the arrays 307A, 307B and 307C are identical to that of the first light emitting diodes 102. In this case, the arrays 307A, 307B and 307C constituted by the fifth light emitting diodes 308 can be regarded as one of the plurality of the first arrays 304 as described, which are formed in the light emitting diode substrate 300. The third array 306 and the fourth array can be disposed between two adjacent ones of these plurality of the first arrays 304 either constituted by the first light emitting diodes 102 or constituted by the fifth light emitting diodes 308.

Figure 4:
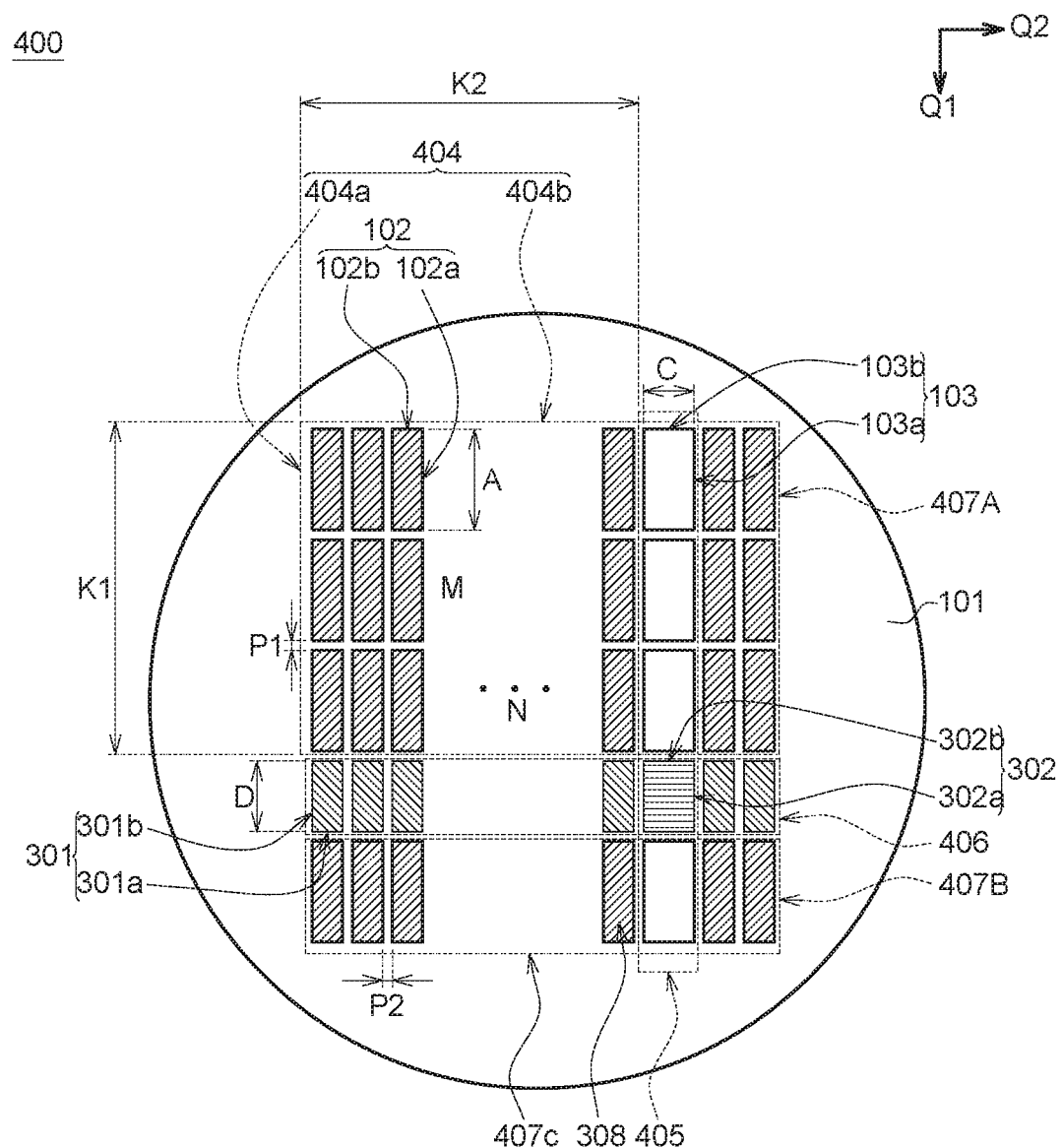
FIG. 4 is a top view illustrating a light emitting diode substrate according to a fourth embodiment of the disclosure.

FIG. 4 is a top view illustrating a light emitting diode substrate 400 according to a fourth embodiment of the disclosure. The structure of the light emitting diode substrate 400 is similar to that of the light emitting diode substrate 300 except that there is a gap between two adjacent ones of the first light emitting diodes 102, the second light emitting diodes 103, the third light emitting diode chips 301, the fourth light emitting diode 302 and the fifth light emitting diodes 308. For example, there is a distance substantially equal to the first pitch P1 between the two adjacent rows of the first light emitting diodes 102 involved in the first array 404; there is a distance substantially equal to the first pitch P1 between the two adjacent rows of the fifth light emitting diodes 308 involved in the arrays 407A, 407B and 407C; there is a distance substantially equal to the second pitch P2 between the two adjacent columns of the first light emitting diodes 102 involved in the first array 404 and there is a distance substantially equal to the second pitch P2 between the two adjacent columns of the fifth light emitting diodes 308 involved in the arrays 407A, 407B and 407C. Wherein the rows of the first light emitting diodes 102 and the fifth light emitting diodes 308 are perpendicular to the first array side 404*a* of the first array 404 (extending in the first direction Q1); and the columns of the first light emitting diodes 102 and the fifth light emitting diodes 308 are perpendicular to the second array side 404*b* of the first array 404 (extending in the second direction Q2). The third array 406 can be respectively separated from the first array 404, the second array 405, the arrays 407A, 407B and 407C for a distance substantially equal to the first pitch P1. The fourth light emitting diode chip 302 is separated from the first array 404 for a distance substantially equal to the first pitch P1 and is separated from the second array 405 for a distance substantially equal to the second pitch P2.

Figure 5:
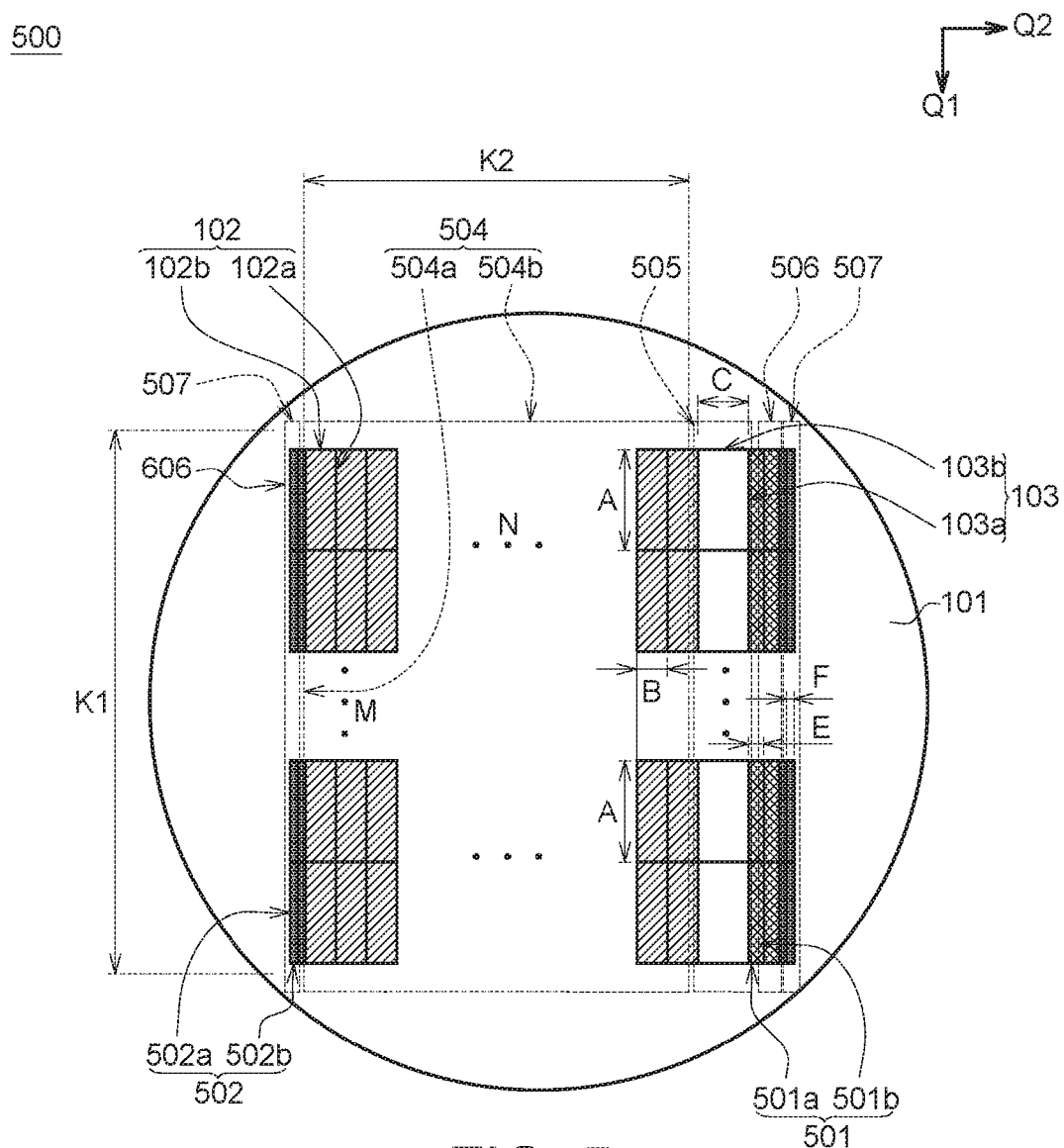
FIG. 5 is a top view illustrating a light emitting diode substrate according to a fifth embodiment of the disclosure.

FIG. 5 is a top view illustrating a light emitting diode substrate 500 according to a fifth embodiment of the disclosure. The structure of the light emitting diode substrate 500 is similar to that of the light emitting diode substrate 100 except the light emitting diode substrate 500 further includes one or more kinds of micro light emitting diode with various dimensions disposed on the substrate 101 to form a plurality of arrays adjacent to the first array 504 and/or the second array 505 respectively. For example, in the embodiment, the light emitting diode substrate 500 further includes a plurality of sixth light emitting diodes 501 and a plurality of seventh light emitting diodes 502 disposed on the substrate 101 to form at least one fifth array 506 and a plurality of sixth arrays 507 adjacent to the first array 504 and/or the second array 505 respectively. In some other embodiments, the light emitting diode substrate 500 may include at least one fifth array 506 and at least one seventh arrays 507 adjacent to the first array 504 and/or the second array 505 respectively.

The sixth light emitting diodes 501 and the seventh light emitting diodes 502 may also have a top view profile shaped as a rectangle, a square, a parallelogram, a diamond or other regular/irregular shape. The sixth light emitting diode 501 has a ninth side 501*a* and a tenth side 501*b* connected with each other. The ninth side 501*a* of the sixth light emitting diode 501 has a ninth side length substantially equal to A; the tenth side 501*b* of the sixth light emitting diode 501 has a tenth side length substantially equal to E. The ninth sides 501*a* of the sixth light emitting diode 501 are perpendicular to the first array side 504*a* (extending in the first direction Q1), and the tenth sides 501*b* of the sixth light emitting diode 501 are perpendicular to the second array side 504*b* (extending in the second direction Q2). The seventh light emitting diode 502 has a eleventh side 502*a* and a twelfth side 502*b* connected with each other. The eleventh side 502*a* of the seventh light emitting diode 502 has an eleventh side length substantially equal to A; and the twelfth side 502*b* of the seventh light emitting diode 502 has a twelfth side length substantially equal to E. The eleventh side 502*a* of the seventh light emitting diode 502 are perpendicular to the first array side 504*a* (extending in the first direction Q1), and the twelfth side 502*b* of the seventh light emitting diode 502 are perpendicular to the second array side 504*b* (extending in the second direction Q2). In the embodiment, the sixth light emitting diodes 501 and the seventh light emitting diodes 502 that is parallel to the first array side 504*a* (extending in the first direction Q1) may have a side length substantially equal to A.

The side length dimensions of the first light emitting diode 102, the sixth light emitting diode 501 and the seventh light emitting diode 502 may not be limited to this regards. In some embodiments, the relationship between the side length dimensions of the first light emitting diode 102, the second light emitting diode 103, the sixth light emitting diode 501 and the seventh light emitting diode 502 may be represented by the following equation:

$$100\% > \left|\frac{C-B}{B}\right| > 1\%, 100\% > \left|\frac{E-B}{B}\right| > 1\%$$
$$\text{and } 100\% > \left|\frac{F-B}{B}\right| > 1\%$$

Wherein B is different from C; B can be greater than or less than C; E is different from B; E can be greater than or less than B; F is different from B and D can be greater than, equal to or less than B.

Figure 6:
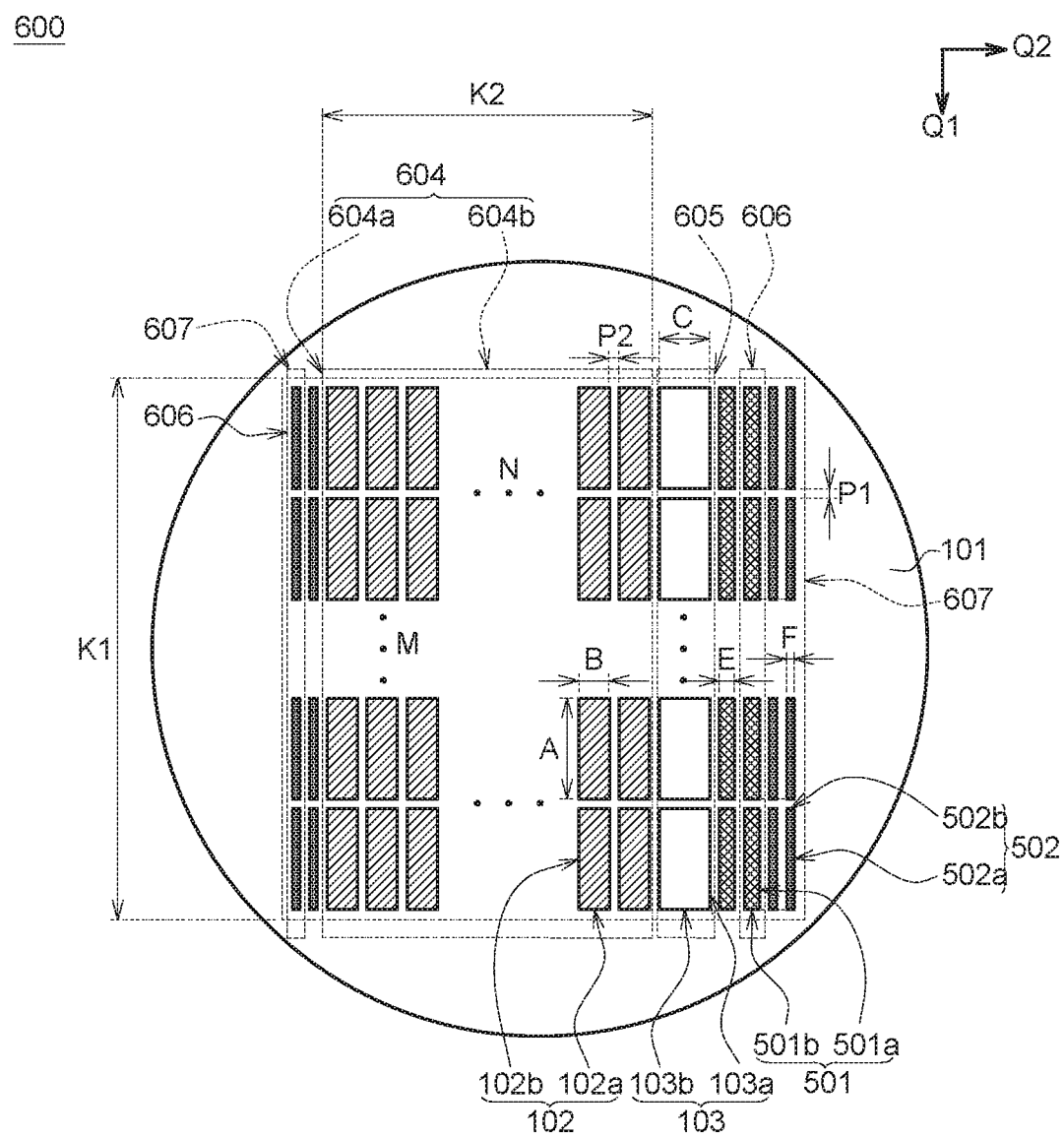
FIG. 6 is a top view illustrating a light emitting diode substrate according to a sixth embodiment of the disclosure.

FIG. 6 is a top view illustrating a light emitting diode substrate 600 according to a sixth embodiment of the disclosure. The structure of the light emitting diode substrate 600 is similar to that of the light emitting diode substrate 500 except that there is a gap between two adjacent ones of the first light emitting diodes 102, the second light emitting diodes 103, the sixth light emitting diodes 501 and the seventh light emitting diodes 502.

For example, there is a distance substantially equal to the first pitch P1 between the two adjacent rows of the first light emitting diodes 102 perpendicular to the first direction Q1, and there is a distance substantially equal to the second pitch P2 between the two adjacent columns of the first light emitting diodes 102 perpendicular to the second direction Q2. There is a distance substantially equal to the first pitch P1 between the two adjacent rows constituted by a plurality of the first light emitting diodes 102, the second light emitting diodes 103, the sixth light emitting diodes 501 and the seventh light emitting diodes 502. There is a distance substantially equal to the second pitch P2 between the first array 604 and the second array 605; there is a distance substantially equal to the second pitch P2 between the first array 604 and the fifth array 606; there is a distance substantially equal to the second pitch P2 between the second array 605 and the fifth array 606; there is a distance equal to the second pitch P2 between the fifth array 606 and the sixth array 607; there is a distance equal to the second pitch P2 between two adjacent fifth arrays 606; and there is a distance equal to the second pitch P2 between two adjacent sixth arrays 607. In other words, in the embodiment, whatever two adjacent columns that are constituted by a plurality of the first light emitting diodes 102, the second light emitting diodes 103, the sixth light emitting diodes 501 and the seventh light emitting diodes 502 and perpendicular to the second direction Q2 may be separated with each other for a distance substantially equal to the second pitch P2.

Figure 7:
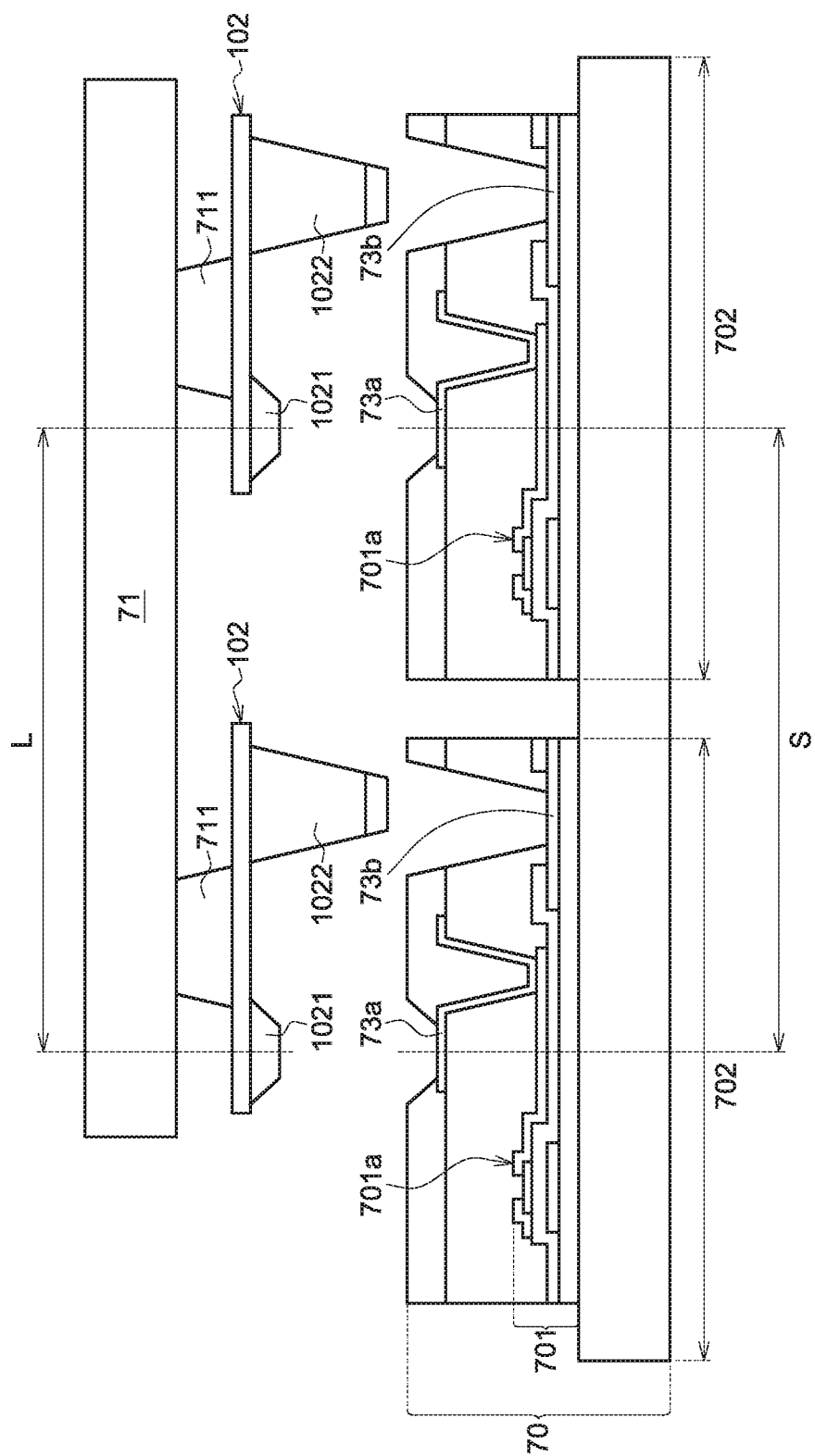
FIG. 7 is a cross-sectional view partially illustrating the processing structure for fabricating a light emitting diode display apparatus according to one embodiment of the disclosure.

The micro light emitting diode provided by the aforementioned light emitting diode substrates 100, 200, 300, 400, 500 and 600 can be applied to form a light emitting diode display apparatus by flip-chip and bounding technology. FIG. 7 is a cross-sectional view partially illustrating the processing structure for the fabrication of a light emitting diode display apparatus 70 according to one embodiment of the disclosure. In some embodiments of the disclosure, the flip-chip and bounding technology can be implemented by applying a plurality of capture devices 711 configured on a tool 71 to pick up the micro light emitting diodes, such as the light emitting diodes 102 and 103, from a light emitting diode substrates (e.g. the light emitting diode substrates 100 as shown in FIG. 1) which is previously subjected to a dicing process for the substrate. The picked light emitting diodes 102 and 103 are then bonded onto a TFT circuit 701 configured in a sub-pixel array of the light emitting diode display apparatus 70 in a manner of jointing the anode and the cathode of the picked light emitting diode (such as the anode 1021 and the cathode 1021 of the picked light emitting diode 102) to the corresponding anode bonding pad 73*a* and the cathode bonding pad 73*b*, which are electrically connected to the TFT circuit 701, respectively. Whereby, the light emitting diodes 102 and 103 integrated within the light emitting diode display apparatus 70 can be drove by the TFT circuit 701 to displaying vivid images.

The sub-pixel array of the light emitting diodes of the display apparatus 70 can be divided into a plurality of sub-pixel regions 702 by the arrangements of the TFT circuit 701. The sub-pixel regions 702 has at least one active device 701*a* used to provide the anode bonding pad 73*a* and the cathode bonding pad 73*b* electrically connected with the anode 1021 and the cathode 1021 of the picked light emitting diodes 102. Regarding the distance S between two adjacent sub-pixel regions 702 (also referred to as the distance between two identical features of two adjacent sub-pixel regions 702, such as the distance between two anode bonding pads 73*a* of two adjacent sub-pixel regions 702) is greater than the distance between two adjacent light emitting diodes formed on the light emitting diode substrates 100 (e.g. the distance is substantially equal to the first side length A of the light emitting diode 102 extending in the first direction Q1, S>A). The distance L between two adjacent capture devices 711 of the tool 71 is equal to the distance S and such is a multiple (n, wherein n is a positive integer) of at least one side extending distance of the various arrays that are respectively constituted by the light emitting diodes (such as the light emitting diodes 102 or/and light emitting diodes 103) with different dimensions on the light emitting diode substrates 100. That is in order to pick up a plurality of the light emitting diodes (such as the light emitting diodes 102 or/and light emitting diodes 103) from the light emitting diode substrates 100 and finely bond them onto the bonding pads of the active devices 701a configured on the TFT circuit 701 at one time.

For example, when the tool 71 is applied to pick up the light emitting diode (such as the light emitting diodes 102 or/and 103) along the first array side 104a of the first array 104 (in the first direction Q1), the distance L between two adjacent capture devices 711 of the tool 71 can be equal to one first extending distance K1 (substantially equal to A×M) of the first array 104. The relationship between the distance S, the distance L and the first extending distance K1 may be represented by the following equation:

$$S=L=n \times A \times M \; (n=1)$$

When the tool 71 is applied to pick up the light emitting diodes (such as the light emitting diodes 102 or/and 103) along the second array side 104b of the first array 104 (in the second direction Q2), the distance L between two adjacent capture devices 711 of the tool 71 can be equal to the sum of one second extending distance K2 (substantially equal to B×N) of the first array 104 and one second side length C of the second side 102b of the first light emitting diode 102. The relationship between the distance S, the distance L, the first extending distance K2 and the second side length C may be represented by the following equation:

$$S=L=n \times (B \times N + C) \; (n=1)$$

In another embodiment of the disclosure, the light emitting diode display apparatus 70 is formed with the light emitting diodes 102 and/or 103 provided by the light emitting diode structure 200, as depicted in FIG. 2. When the tool 71 is applied to pick up the light emitting diodes (such as the light emitting diodes 102 or/and 103) along the first array side 204a of the first array 204 (in the first direction Q1), the distance L between two adjacent capture devices 711 of the tool 71 can be equal to one first extending distance K1 (substantially equal to [(A+P1)×M]) of the first array 204. The relationship between the distance S, the distance L and the first extending distance K1 may be represented by the following equation:

$$S=L=n \times [(A+P1) \times M] \; (n=1)$$

When the tool 71 is applied to pick up the light emitting diodes (such as the light emitting diodes 102 or/and 103) along the second array side 204b of the first array 204 (in the second direction Q2), the distance L between two adjacent capture devices 711 of the tool 71 can be equal to the sum of one second extending distance K2 (substantially equal to [(B+P2)×N]) of the first array 204, one second side length C of the second side 102b of the first light emitting diode 102 and one second pitch P2. The relationship between the distance S, the distance L, the first extending distance K2 and the second side length C may be represented by the following equation:

$$S=L=n \times [N \times (B+P2)+1 \times (C+P2)] \; (n=1)$$

In another embodiment of the disclosure, the light emitting diode display apparatus 70 is formed with the light emitting diodes provided by the light emitting diode structure 300, as depicted in FIG. 3. When the tool 71 is applied to pick up the light emitting diodes (such as the light emitting diodes 102, 103, 301 or/and 302) along the first array side 304a of the first array 304 (in the first direction Q1), the distance L between two adjacent capture devices 711 of the tool 71 can be equal to the sum of one first extending distance K1 (substantially equal to A×M]) of the first array side 304, one fifth side length D of the fifth side 301a of the third light emitting diode 301. The relationship between the distance S, the distance L, the first extending distance K1 and the fifth side length D may be represented by the following equation:

$$S=L=n \times (A \times M + D) \; (n=1)$$

When the tool 71 is applied to pick up the light emitting diodes (such as the light emitting diodes 102, 103, 301 or/and 302) along the second array side 304b of the first array 304 (in the second direction Q2), the distance L between two adjacent capture devices 711 of the tool 71 can be equal to the sum of one second extending distance K2 (equal to B×N) of the first array 304 and one second side length C of the second side 102b of the first light emitting diode 102. The relationship between the distance S, the distance L, the first extending distance K2 and the second side length C may be represented by the following equation:

$$S=L=n \times (B \times N + C) \; (n=1)$$

In another embodiment of the disclosure, the light emitting diode display apparatus 70 is formed with the light emitting diodes provided by the light emitting diode structure 400, as depicted in FIG. 4. When the tool 71 is applied to pick up the light emitting diodes (such as the light emitting diodes 102, 103, 301 or/and 302) along the first array side 404a of the first array 404 (in the first direction Q1), the distance L between two adjacent capture devices 711 of the tool 71 can be equal to the sum of one first extending distance K1 (substantially equal to [(A+P1)×M]) of the first array side 404, one fifth side length D of the fifth side 301a of the third light emitting diode 301 and one first pitch P1. The relationship between the distance S, the distance L, the first extending distance K1, the fifth side length D and the first pitch P1 may be represented by the following equation:

$$S=L=n \times [M \times (A+P1)+1 \times (P1+D)] \; (n=1)$$

When the tool 71 is applied to pick up the light emitting diodes (such as the light emitting diodes 102, 103, 301 or/and 302) along the second array side 404b of the first array 404 (in the second direction Q2), the distance L between two adjacent capture devices 711 of the tool 71 can be equal to the sum of one second extending distance K2 (substantially equal to [(B+P2)×N]) of the first array 404, one second side length C of the second side 102b of the first light emitting diode 102 and one second pitch P2. The relationship between the distance S, the distance L, the first extending distance K2, the second side length C and the second pitch P2 may be represented by the following equation:

$$S=L=n \times [(B+P2) \times N+P2+C] \; (n=1)$$

Similarly, the light emitting diode display apparatus 70 can also be formed with the light emitting diodes provided by the light emitting diode structure 600 respectively, as depicted in FIG. 6. The relationship between the distance S, the distance L can also be represented by an equation in accordance with the same logic as described above in previous sections.

In accordance with the aforementioned embodiments of the disclosure, a light emitting diode substrate and a display apparatus applying the same are provided. At least two kinds of light emitting diodes with different dimensions are formed on the light emitting diode substrate, and the dimension parameters and the arrangements of these at least two kinds of light emitting diodes that are formed on the light emitting diode substrate can be determined in accordance with (by cross-referencing) the dimension and design parameters of the tools to pick up the light emitting diodes from the light emitting diode substrate and the dimension and design parameters of a sub-pixel array of the display apparatus on which the light emitting diodes are bonded. The tools to implement the process for fabricating the display apparatus thus can pick up a plurality of light emitting diodes formed on the light emitting diode substrate at one time and then bond the picked light emitting diodes onto the sub-pixel array of the display apparatus more precisely.

While the disclosure has been described by examples and in terms of the preferred embodiment(s), it should be understood that the disclosure is not limited thereto. On the contrary, it is intended to con various modifications and similar arrangements and procedures, and the scope of appended claims therefore should be accorded with the broadest interpretation so as to encompass all such modifications and similar arrangements and procedures.

What is claimed is:

1. A light emitting diode substrate comprising:
    a substrate;
    a plurality of first light emitting diodes, disposed on the substrate, wherein the plurality of first light emitting diodes are arranged in a first direction and a second direction to form a first array having a first array side extending in the first direction and a second array side extending in the second direction, the first direction is not parallel to the second direction, and each of the first light emitting diode has a first side length extending in the first direction and a second side length extending in the second direction;
    a plurality of second light emitting diodes, disposed on the substrate, wherein the plurality of second light emitting diodes are arranged to form a second array adjacent to the first array side of the first array, and each of the second light emitting diodes has a third side length extending in the first direction and a fourth side length extending in the second direction; and
    a plurality of third light emitting diodes, disposed on the substrate, wherein the plurality of third light emitting diodes are arranged to form a third array adjacent to the second array side of the first array, and each of the third light emitting diodes has a fifth side length extending in the first direction and a sixth side length extending in the second direction;
    wherein a first absolute difference between the first side length and the third side length is different from a second absolute difference between the second side length and the fourth side length, and a third absolute difference between the first side length and the fifth side length is different from a fourth absolute difference between the second side length and the sixth side length.

2. The light emitting diode substrate according to claim 1, wherein the first absolute difference is less than the second absolute difference.

3. The light emitting diode substrate according to claim 1, wherein a relationship between the second side length and the fourth side length is represented by the following equation:

$$100\% > \left|\frac{C-B}{B}\right| > 1\%,$$

wherein B represents the second side length; and C represents the fourth side length.

4. The light emitting diode substrate according to claim 1, further comprising:
    a fourth light emitting diode, disposed adjacent to a corner of the first array, and the fourth light emitting diode having a seventh side length extending in the first direction and a eighth side length extending in the second direction.

5. The light emitting diode substrate according to claim 4, wherein the seventh side length is different from the eighth side length.

6. The light emitting diode substrate according to claim 5, wherein a relationship between the first side length and the fifth side length is represented by the following equation:

$$100\% > \left|\frac{D-A}{A}\right| > 1\%,$$

wherein A represents the first side length, and D represents the fifth side length.

7. The light emitting diode substrate according to claim 1, further comprising:
    a first gap is between adjacent two of the first light emitting diodes;
    a second gap is between adjacent two of the second light emitting diodes;
    a third gap is between adjacent two of the first light emitting diodes; and
    a fourth gap is between adjacent two of the third light emitting diodes,
    wherein the first gap and the second gap are arranged in the second direction, and the third gap and the fourth gap are arranged in the first direction.

8. The light emitting diode substrate according to claim 1, wherein the third absolute difference is greater than the fourth absolute difference.

9. The light emitting diode substrate according to claim 1, wherein the second absolute difference is different from the third absolute difference.

10. The light emitting diode substrate according to claim 5, wherein the seventh side length is less than the eighth side length.

11. The light emitting diode substrate according to claim 1, wherein a display apparatus is formed of picking up at least one of the plurality of first light emitting diodes from the light emitting diode substrate and then bond onto a display substrate.

12. The light emitting diode substrate according to claim 11, wherein the display apparatus is formed of picking up at least one of the plurality of second light emitting diodes or at least one of the plurality of third light emitting diodes from the light emitting diode substrate and then bond onto the display substrate.

* * * * *